(12) United States Patent
Kumar et al.

(10) Patent No.: US 7,701,263 B2
(45) Date of Patent: Apr. 20, 2010

(54) CASCODE DRIVER WITH GATE OXIDE PROTECTION

(75) Inventors: Anil Kumar, Austin, TX (US); Shawn Searles, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 16 days.

(21) Appl. No.: 12/059,595

(22) Filed: Mar. 31, 2008

(65) Prior Publication Data

US 2009/0243665 A1    Oct. 1, 2009

(51) Int. Cl.
*H03B 1/00* (2006.01)
(52) U.S. Cl. .................. 327/108; 327/543; 327/112
(58) Field of Classification Search ......... 327/108–112, 327/170, 379, 389, 391, 538–543; 326/82, 326/83, 22–27, 86, 87; 365/230.06
See application file for complete search history.

(56) References Cited

U.S. PATENT DOCUMENTS

| | | | |
|---|---|---|---|
| 6,346,829 B1 * | 2/2002 | Coddington | ................. 326/81 |
| 6,876,182 B1 | 4/2005 | Aude | |
| 7,126,389 B1 | 10/2006 | McRae et al. | |
| 7,157,683 B2 * | 1/2007 | Lee et al. | ................. 250/214 R |
| 7,218,167 B2 * | 5/2007 | Chatal et al. | ................. 327/539 |
| 7,283,406 B2 | 10/2007 | Lu et al. | |

* cited by examiner

*Primary Examiner*—Long Nguyen
*Assistant Examiner*—Sibin Chen
(74) *Attorney, Agent, or Firm*—Meyertons, Hood, Kivlin, Kowert & Goetzel, P.C.; B. Noel Kivlin

(57) ABSTRACT

An apparatus including a bias voltage generator and one or more cascode drivers. Each of the one or more cascode drivers may include a plurality of cascode transistors. The bias voltage generator may control the cascode bias voltages provided to the cascode transistors based on a plurality of programmable control bits received by the bias voltage generator. The received plurality of programmable control bits may include a first set of programmable control bits, which may be used to control the magnitude of the cascode bias voltages, and a second set of programmable control bits, which may be used to control the stability of the cascode bias voltages.

13 Claims, 4 Drawing Sheets

CASCODE DRIVER WITH GATE OXIDE PROTECTION

BACKGROUND OF THE INVENTION

1. Field of the Invention

This invention relates to driver circuits and, more particularly, to a cascode driver circuit with gate oxide protection.

2. Description of the Related Art

Drivers are electronic circuits that are typically used to control other circuits or components. A cascode driver is a specific type of driver that includes transistors at the output of the driver arranged in a cascode configuration. Various cascode driver designs include a structure where the main supply voltage of the circuit is higher than the gate oxide voltage tolerance of the cascode driver transistors. To protect the gate oxide of the cascode transistors, the driver circuitry is typically designed such that the cascode bias voltage provided to the transistors is maintained at half the supply voltage. This type of driver design may result in a non-linear driver, which does not make use of the current carrying capability of the driver, and usually takes up a significant amount of space.

SUMMARY

Various embodiments are disclosed of an apparatus including a bias voltage generator and one or more cascode drivers. Each of the one or more cascode drivers may include a plurality of cascode transistors. In one embodiment, the bias voltage generator may control the cascode bias voltages provided to the cascode transistors based on a plurality of programmable control bits received by the bias voltage generator. In one embodiment, the received plurality of programmable control bits may include a first set of programmable control bits, which may be used to control the magnitude of the cascode bias voltages, and a second set of programmable control bits, which may be used to control the current and hence the stability of the cascode bias voltages.

Figure 1:
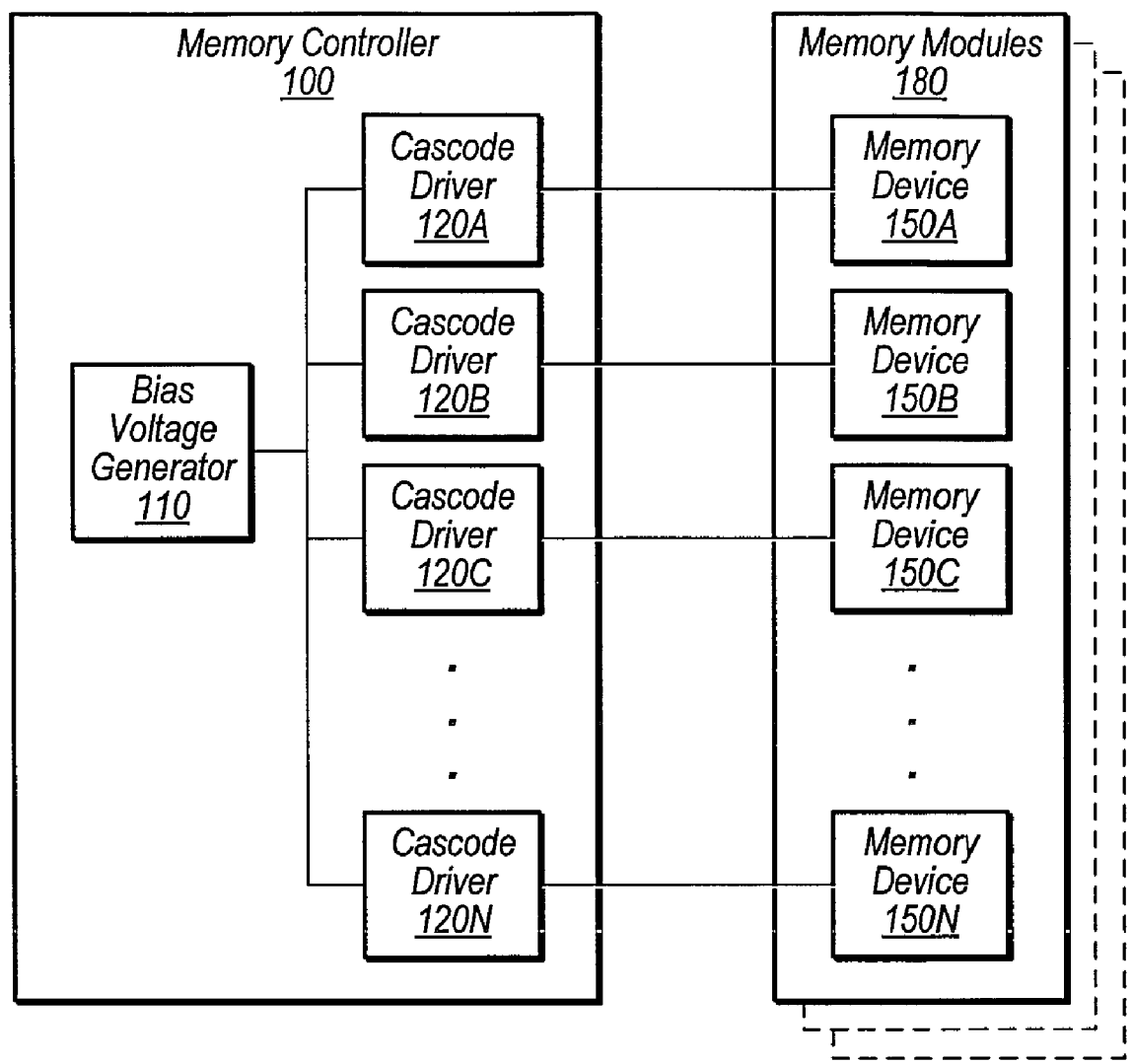
FIG. 1 is a block diagram of one embodiment of a memory subsystem comprising a memory controller and one or more memory modules.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram is shown of a memory subsystem comprising a memory controller 100 and one or more memory modules 180, according to one embodiment. As illustrated, memory controller 100 may include a bias voltage generator 110 and a plurality of cascode driver circuits, e.g., cascode drivers 120A-N (hereinafter cascode drivers 120). Bias voltage generator 110 may be coupled to each of the cascode drivers 120. Memory modules 180 may each include a plurality of memory devices, e.g., memory devices 150A-N (hereinafter memory devices 150). Cascode drivers 120 may each be coupled to at least one of the memory devices 150. In one specific implementation, memory controller 100 may include bias voltage generator 110 to control the cascode bias voltage provided to the output circuitry of the cascode drivers 120 for driving the memory devices 150, as will be further described below.

Memory controller 100 and memory modules 180 may be connected to a circuit board or motherboard of a computer system. In various embodiments, memory controller 100 may be integrated within a processor of the computer system (e.g., processor 400 of FIG. 4). In other embodiments, memory controller 100 may be implemented external to the processor via a separate chipset. Memory modules 180 may form the main system memory of the computer system (e.g., system memory 440 of FIG. 4). Memory modules 180 may be various types of memory modules, such as Dual In-line Memory Modules (DIMMs), and memory devices 150 may be various types of RAM devices, such as DDR2 and DDR3 SDRAM devices. Memory controller 100 and memory modules 180 may be comprised in any of various types of computing or processing systems, e.g., a personal computer (PC), a workstation, a server blade, a portable computing device, a game console, a system-on-a-chip (SoC), a television system, an audio system, among others.

During operation, in one embodiment, bias voltage generator 110 controls the cascode bias voltage provided to the output circuitry of each of the cascode drivers 120 for driving the memory devices 150. For instance, in one specific implementation, cascode drivers 120 may be used for driving data (i.e., DQ) and/or data strobe signals (i.e., DQS) for the memory devices 150. In one embodiment, bias voltage generator 110 may control the cascode bias voltage provided to the output circuitry of each of the cascode drivers 120 based on a plurality of programmable control bits, as will be further described below with reference to FIGS. 2 and 3.

It should be noted that the components described with reference to FIG. 1 are meant to be exemplary only, and are not intended to limit the invention to any specific set of components or configurations. For example, in various embodiments, one or more of the components described may be omitted, combined, modified, or additional components included, as desired. For instance, it is noted that memory controller 100 may be designed to include more than, or less than, four cascode driver circuits 120, and each memory module 180 may include more than, or less than, four memory devices 150. Also, it is further noted that bias voltage generator 110 and cascode drivers 120 may be employed in other applications where cascode drivers are used to drive other components, in addition to memory subsystem applications.

Figure 2:
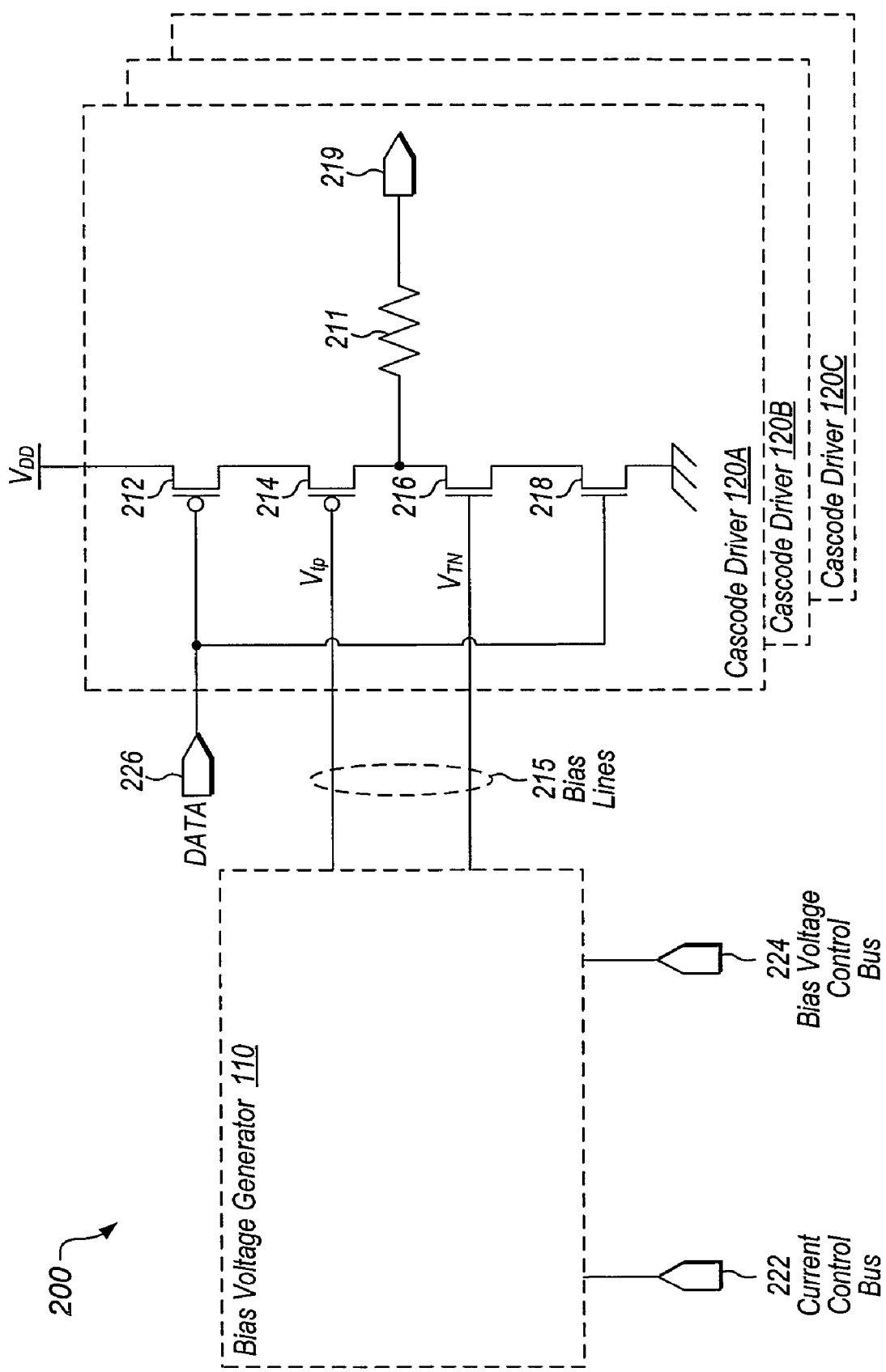
FIG. 2 is a diagram of one embodiment of an apparatus including a bias voltage generator and at least one cascode driver.

FIG. 2 is a diagram of one embodiment of an apparatus 200 including bias voltage generator 110 and at least one cascode driver 120 (e.g., cascode drivers 120A-N). In one embodiment, apparatus 200 may be an integrated circuit of a device, e.g., memory controller 100 of FIG. 1. It is noted, however, that in other embodiments apparatus 200 may be two or more integrated circuits, which may be connected to a circuit board of the system.

As illustrated, in one specific implementation, bias voltage generator 110 may include a control bus 222 and a control bus 224, and the at least one cascode driver 120 may include data input terminal 226, cascode transistors 212, 214, 216, and 218, resistor 211, and driver output terminal 219. Bias voltage generator 110 may be connected to the one or more cascode drivers 120 via bias lines 215.

During operation, in one embodiment, bias voltage generator 110 controls the cascode bias voltages ($V_{TP}$ and $V_{TN}$) provided to the at least one cascode driver 120 for driving one or more circuits or devices (e.g., memory devices 150 of FIG. 1) connected to the driver output terminal 219. For instance, if apparatus 200 includes six cascode drivers 120, bias voltage generator 110 may control the cascode bias voltages provided to each of the six cascode drivers 120.

In one specific implementation, bias voltage generator 110 may control the cascode bias voltages ($V_{TP}$ and $V_{TN}$) provided to the cascode transistors (214 and 216) of the at least one cascode driver 120 based on a plurality of programmable control bits, e.g., current control bits and bias voltage control bits. Specifically, bias voltage generator 110 may control the cascode bias voltage $V_{TP}$ provided to cascode transistors 214, and the cascode bias voltage $V_{TN}$ provided to cascode transistors 216. The current control bits, which may be received via control bus 222, may control the stability of the cascode bias voltages provided to the cascode transistors 214 and 216. The bias voltage control bits, which may be received via control bus 224, may control the magnitude of the cascode bias voltages for the cascode transistors 214 and 216. In one embodiment, the programmable control bits may be received from a processing unit of the system, e.g., processor 400 shown in FIG. 4, and in some implementations, the control bits may be programmed by changing the BIOS of the system. It is noted, however, that in other embodiments, the control bits may be programmed and generated by other mechanisms depending on the application.

The programmable control bits may control the magnitude and stability of the cascode bias voltages $V_{TP}$ and $V_{TN}$ via a number of control loops within the bias voltage generator 110, e.g., as illustrated with reference to FIG. 3. The data (received via data input terminal 226) and the cascode bias voltages (received via bias lines 215) may be used to turn on and off the cascode transistors 214 and 216 of the at least one cascode driver 120 for driving one or more circuits or devices connected to the output terminal 219.

Figure 3:
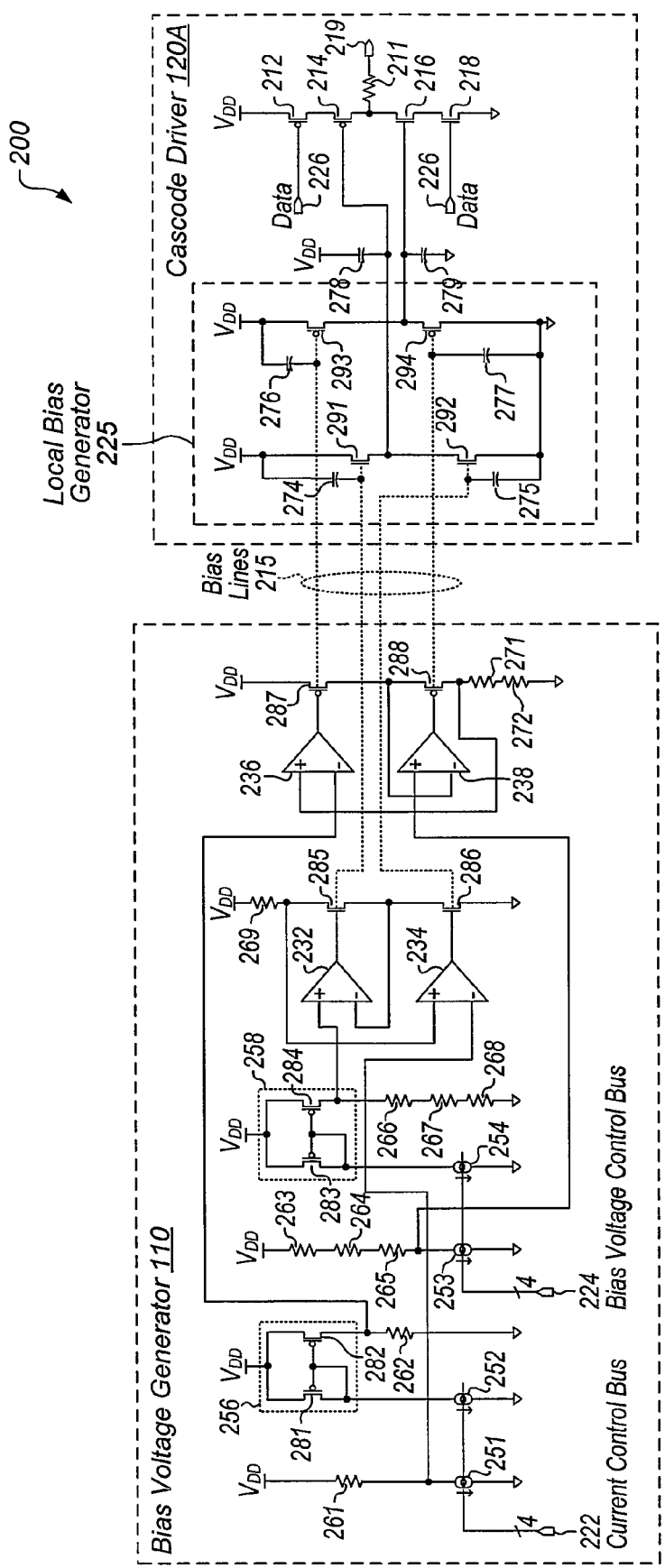
FIG. 3 is a circuit diagram of one embodiment of an apparatus including a bias voltage generator and at least one cascode driver.

FIG. 3 is a circuit diagram of one embodiment of an apparatus 200 including bias voltage generator 110 and at least one cascode driver 120. As illustrated, in one specific implementation, bias voltage generator 110 may include control buses 222 and 224, programmable current sources 251-254, resistors 261-269 and 271-272, transistors 281-288, and amplifiers 232, 234, 236, and 238. Cascode driver 120 may include transistors 291-294, capacitors 274-279, data input terminal 226, cascode transistors 212, 214, 216, and 218, resistor 211, and driver output terminal 219.

As described above, bias voltage generator 110 may control the cascode bias voltages ($V_{TP}$ and $V_{TN}$) provided to the cascode transistors 214 and 216 of the at least one cascode driver 120. In one embodiment, the at least one cascode driver 120 may include a local bias generator 225 coupled to the cascode transistors 214 and 216. In this embodiment, bias voltage generator 110 may control local bias generator 225 to provide the cascode bias voltages $V_{TP}$ and $V_{TN}$ to the cascode transistors 214 and 216 of the at least one cascode driver 120 based on a plurality of programmable control bits, e.g., current control bits and bias voltage control bits. It is noted, however, that in other embodiments, bias voltage generator 110 may directly provide the cascode bias voltages $V_{TP}$ and $V_{TN}$ to the cascode transistors 214 and 216 (e.g., as illustrated in FIG. 2). In other words, in these embodiments, bias voltage generator 110 may include circuitry that directly generates the cascode bias voltages $V_{TP}$ and $V_{TN}$, e.g., circuitry similar to local bias generator 225, in addition to the circuitry that controls the magnitude and stability of the cascode bias voltages $V_{TP}$ and $V_{TN}$.

The current control bits may control the stability of the cascode bias voltages provided to the cascode transistors 214 and 216, and the bias voltage control bits may control the magnitude of the cascode bias voltages for the cascode transistors 214 and 216. As illustrated in FIG. 3, the programmable control bits may control the magnitude and stability of the cascode bias voltages via a number of control loops within the bias voltage generator 110. Specifically, amplifiers 232, 234, 236, and 238 in combination with the programmable current sources and current mirrors of bias voltage generator 110 form control loops that control the magnitude and stability of the cascode bias voltages provided to the cascode transistors 214 and 216.

In some embodiments, the plurality of programmable control bits may also be used to place the at least one cascode driver 120 in a low-power mode. For instance, in one specific implementation, when control bits are received which have a predetermined value indicative of a power down mode, the programmable current sources 251-254 may turn off, which may cause both bias voltage generator and the at least one cascode driver 120 to enter the low-power mode. This low-power mode option may be implemented without overstressing the gates of the cascode transistors and without adding a significant number of components.

In various embodiments, the functionally of bias voltage generator 110 may allow the design to provide cascode bias voltages that are relatively close to the breakdown voltage of each of the cascode transistors 214 and 216. For example, in one embodiment, the cascode bias voltage may be designated a specific voltage level that is within a voltage range that is 1-5% below the breakdown voltage. In another embodiment, the cascode bias voltage may be designated a specific voltage level that is within a voltage range that is 6-10% below the breakdown voltage. In yet another embodiment, the cascode bias voltage may be designated a specific voltage level that is within a voltage range that is 11-15% below the breakdown voltage.

In these embodiments, even though relatively large cascode voltages may be allowed, the bias voltage generator 110 and related circuitry may control the magnitude and stability of the cascode voltages, and therefore may provide gate-oxide protection for the cascode transistors. At the same time, in this design, the cascode voltage may follow the supply voltage and therefore this design may utilize the current carrying capabilities of the cascode driver, while still providing gate-oxide protection. Furthermore, this design may allow the use of smaller transistors and other components, which may save area and decrease power consumption.

As illustrated, in one specific implementation, control bus 222 may be coupled to programmable current sources 251 and 252. Programmable current source 251 may be coupled to resistor 261 and to a first terminal of amplifier 234. Programmable current source 252 may be coupled to an input transistor 281 of current mirror 256. The output transistor 282 of current mirror 256 may be coupled to resistor 262 and to a first terminal of amplifier 236.

In this implementation, control bus 224 may be coupled to programmable current sources 253 and 254. Programmable current source 253 may be coupled to resistor 265 and to a first terminal of amplifier 238. Resistor 265 may be coupled to resistor 264, which may be further coupled to resistor 263. Programmable current source 254 may be coupled to an input transistor 283 of current mirror 258. The output transistor 284 of current mirror 258 may be coupled to resistor 266 and to a first terminal of amplifier 232. Resistor 266 may be coupled to resistor 267, which may be further coupled to resistor 268.

Additionally, in this implementation, the output terminal of amplifier 232 may be coupled to the gate terminal of transistor 285 and to the gate terminal of transistor 291. The drain terminal of transistor 285 may be coupled to a second terminal of amplifier 234 and to resistor 269. The source terminal of transistor 285 may be coupled to a second terminal of amplifier 232 and to the drain terminal of transistor 286. The output terminal of amplifier 234 may be coupled to the gate terminal of transistor 286 and to the gate terminal of transistor 292. The output terminal of amplifier 236 may be coupled to the gate terminal of transistor 287 and to the gate terminal of transistor 293. The drain terminal of transistor 287 may be coupled to a second terminal of amplifier 238 and to the source terminal of transistor 288. The output terminal of amplifier 238 may be coupled to the gate terminal of transistor 288 and to the gate terminal of transistor 294. The drain terminal of transistor 288 may be coupled to a second terminal of amplifier 236 and to resistor 271. Resistor 271 may be coupled to resistor 272. In this loop, amplifier 236 monitors the current through resistor 271.

Also, in this implementation, the drain terminal of transistor 291 may be coupled to capacitor 274, which may be further coupled to the gate terminal of transistor 291. The source terminal of transistor 291 may be coupled to the gate terminal of cascode transistor 214 and to the drain terminal of transistor 292. The source terminal of transistor 292 may be coupled to capacitor 275, which may be further coupled to the gate terminal of transistor 292. The source terminal of transistor 293 may be coupled to capacitor 276, which may be further coupled to the gate terminal of transistor 293. The drain terminal of transistor 293 may be coupled to the gate terminal of cascode transistor 216 and to the source terminal of transistor 294. The drain terminal of transistor 294 may be coupled to capacitor 277, which may be further coupled to the gate terminal of transistor 294.

Furthermore, in this implementation, data input terminal 226 may be coupled to the gate terminal of cascode transistor 212 and to the gate terminal of cascode transistor 218. The drain terminal of cascode transistor 212 may be coupled to the source terminal of cascode transistor 214. The drain terminal of cascode transistor 214 may be coupled to resistor 211 and to the drain terminal of cascode transistor 216. Resistor 211 may be coupled to the driver output terminal 219. The source terminal of cascode transistor 216 may be coupled to the drain terminal of cascode transistor 218. The voltage supply $V_{DD}$ may be coupled to at least resistor 261, current mirror 256, resistor 263, current mirror 258, resistor 269, the source terminal of transistor 287, the drain terminal of transistor 291, the source terminal of transistor 293, capacitor 278, and the source terminal of cascode transistor 212.

In one specific embodiment, apparatus 200 may be a memory controller, e.g., memory controller 100 as shown in FIG. 1. It is noted, however, that in other embodiments apparatus 200 may be implemented in a variety of other applications where cascode drivers are used to drive other components. In various embodiments, bias voltage generator 110 and cascode driver 120 may each be included in a separate integrated circuit. It is noted, however, that in other embodiments bias voltage generator 110 and cascode driver 120 may both be included in a single integrated circuit.

It should be noted that the components described with reference to FIGS. 2 and 3 are meant to be exemplary only, and are not intended to limit the invention to any specific set of components or configurations. For example, in various embodiments, one or more of the components described may be omitted, combined, modified, or additional components included, as desired. For instance, while in some embodiments the transistors of bias voltage generator 110 and cascode driver 120 may be field-effect transistors (FETs), such as metal-oxide semiconductor FETs (MOSFETs), it is noted that in other embodiments bias voltage generator 110 and cascode driver 120 may include other types of transistors.

Figure 4:
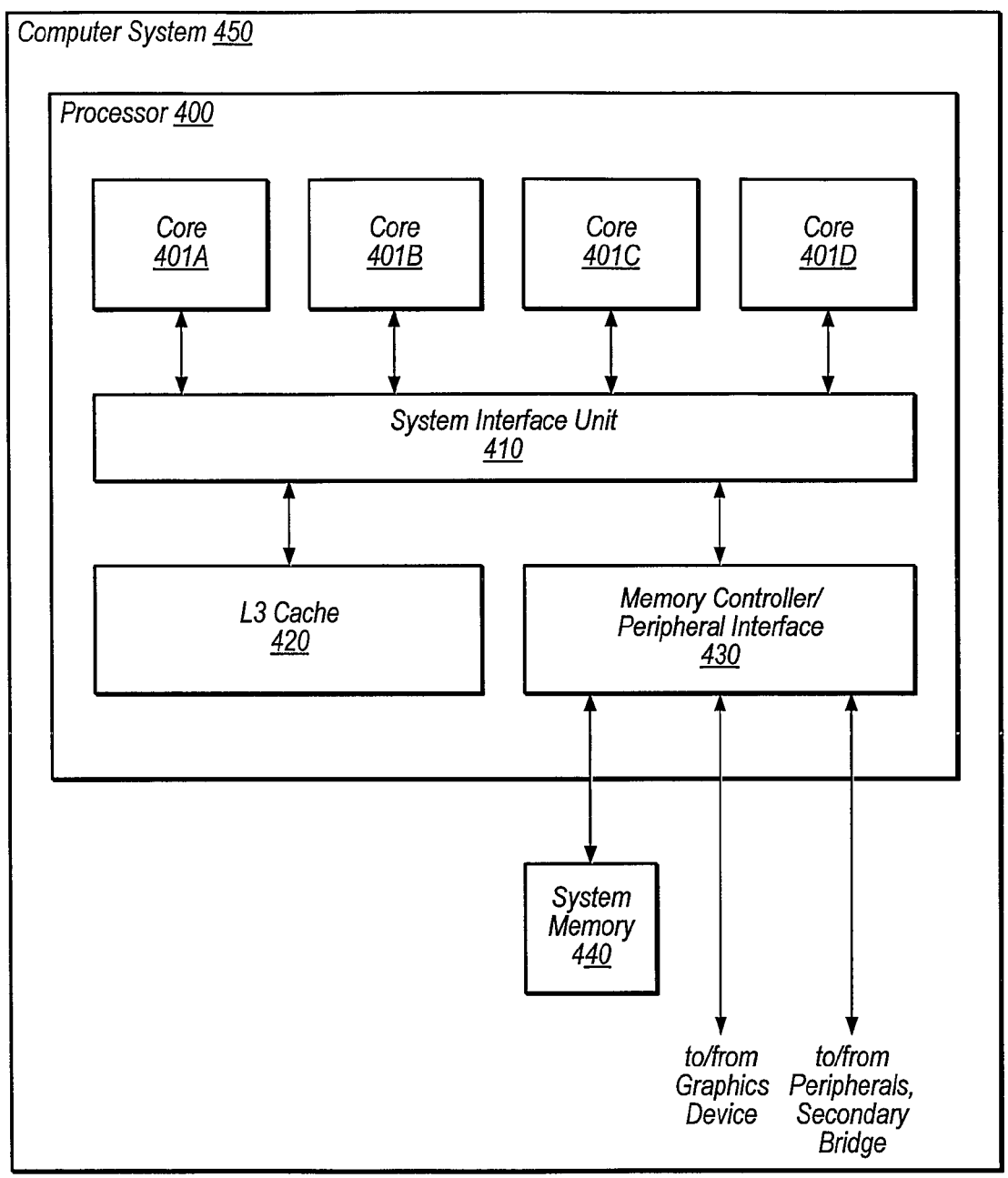
FIG. 4 is a block diagram of one embodiment of a computer system including a processor and a system memory.

FIG. 4 is a block diagram of one embodiment of a computer system 450 including a processor 400 and a system memory 440. Processor 400 may include one or more processor cores, e.g., processor cores 401A-D, fabricated as part of a single integrated circuit along with other structures. Each processor core 401 may be configured to execute instructions that may be stored in a system memory 440. Such instructions may be defined according to a particular instruction set architecture (ISA). For example, processor cores 401 may be configured to implement a version of the x86 ISA, although in other embodiments cores 401 may implement a different ISA or a combination of ISAs.

In the illustrated embodiment, each of the cores 401 may couple to an L3 cache 420 and a memory controller/peripheral interface unit (MCU) 430 via a system interface unit (SIU) 410. In one embodiment, L3 cache 420 may be configured as a unified cache, implemented using any suitable organization, that operates as an intermediate cache between L2 caches of cores 401 and system memory 440.

MCU 430 may be configured to interface processor 400 directly with system memory 440. For example, MCU 430 may be configured to generate the signals necessary to support one or more different types of random access memory (RAM) such as Dual Data Rate Synchronous Dynamic RAM (DDR SDRAM), DDR2 SDRAM, Fully Buffered Dual Inline Memory Modules (FB-DIMM), or another suitable type of memory that may be used to implement system memory 440. MCU 430 may include a bias voltage generator 110 and one or more cascode driver circuits 120, as described above with reference to FIG. 1. System memory 440 may be configured to store instructions and data that may be operated on by the various cores 401 of processor 400, and the contents of system memory 440 may be cached by various ones of the caches described above.

Additionally, MCU 430 may support other types of interfaces to processor 400. For example, MCU 430 may implement a dedicated graphics processor interface such as a version of the Accelerated/Advanced Graphics Port (AGP) interface, which may be used to interface processor 400 to a graphics-processing subsystem, which may include a separate graphics processor, graphics memory and/or other components. MCU 430 may also be configured to implement one or more types of peripheral interfaces, e.g., a version of the PCI-Express bus standard, through which processor 400 may interface with peripherals such as storage devices, graphics devices, networking devices, etc. In some embodiments, a secondary bus bridge (e.g., a "south bridge") external to processor 400 may be used to couple processor 400 to other peripheral devices via other types of buses or interconnects. It is noted that while memory controller and peripheral interface functions are shown integrated within processor 400 via MCU 430, in other embodiments these functions may be implemented externally to processor 400 via a conventional "north bridge" arrangement. For example, various functions of MCU 430 may be implemented via a separate chipset rather than being integrated within processor 400.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
   one or more cascode drivers configured to drive one or more devices coupled to the apparatus, wherein each of the one or more cascode drivers includes a plurality of cascode transistors;
   a bias voltage generator coupled to the one or more cascode drivers, wherein the bias voltage generator is configured to control cascode bias voltages provided to the cascode transistors of the one or more cascode drivers, wherein the bias voltage generator is configured to control the cascode bias voltages provided to the cascode transistors based on a plurality of programmable control bits received by the bias voltage generator;
   wherein the cascode bias voltages provided to the cascode transistors of each of the one or more cascode drivers include a first cascode bias voltage ($V_{TN}$) provided to a first cascode transistor of each cascode driver and a second cascode bias voltage ($V_{TP}$) provided to a second cascode transistor of each cascode driver; and
   a voltage supply ($V_{DD}$) coupled to the bias voltage generator and the one or more cascode drivers, wherein the bias voltage generator is configured to maintain the first cascode bias voltage ($V_{TN}$) at a designated voltage level that is below a breakdown voltage associated with the first cascode transistor, and maintain the second cascode bias voltage ($V_{TP}$) at a voltage level that is equal to the difference between the voltage supply ($V_{DD}$) and the first cascode bias voltage ($V_{TN}$).

2. The apparatus of claim 1, wherein the received plurality of programmable control bits includes a first set of programmable control bits, wherein the first set of programmable control bits is a set of bias voltage control bits used to control the magnitude of the cascode bias voltages.

3. The apparatus of claim 2, wherein the received plurality of programmable control bits further includes a second set of programmable control bits, wherein the second set of programmable control bits is a set of current control bits used to control the stability of the cascode bias voltages.

4. The apparatus of claim 1, wherein each of the one or more cascode drivers includes a local bias generator coupled to the cascode transistors, wherein the bias voltage generator is configured to control the local bias generator to provide the cascode bias voltages to the cascode transistors based on a plurality of programmable control bits received by the bias voltage generator.

5. The apparatus of claim 1, wherein the bias voltage generator is configured to provide the cascode bias voltages to the cascode transistors of the one or more cascode drivers, and control the magnitude and stability of the cascode bias voltages based on a plurality of programmable control bits received by the bias voltage generator.

6. A memory controller comprising:
   one or more cascode drivers configured to drive one or more memory devices coupled to the memory controller, wherein each of the one or more cascode drivers includes a plurality of cascode transistors;
   a bias voltage generator coupled to the one or more cascode drivers, wherein the bias voltage generator is configured to control cascode bias voltages provided to the cascode transistors of the one or more cascode drivers, wherein the bias voltage generator is configured to control the cascode bias voltages provided to the cascode transistors based on a plurality of programmable control bits received by the bias voltage generator; and
   a voltage supply ($V_{DD}$) coupled to the bias voltage generator and the one or more cascode drivers, wherein the cascode bias voltages provided to the cascode transistors of each of the one or more cascode drivers include a first cascode bias voltage ($V_{TN}$) provided to a first cascode transistor of each cascode driver and a second cascode bias voltage ($V_{TP}$) provided to a second cascode transistor of each cascode driver, wherein the bias voltage generator is configured to maintain the first cascode bias voltage ($V_{TN}$) at a designated voltage level that is below a breakdown voltage associated with the first cascode transistor, and maintain the second cascode bias voltage ($V_{TP}$) at a voltage level that is equal to the difference between the voltage supply ($V_{DD}$) and the first cascode bias voltage ($V_{TN}$).

7. The memory controller of claim 6, wherein the received plurality of programmable control bits includes a first set and a second set of programmable control bits, wherein the first set of programmable control bits is a set of bias voltage control bits used to control the magnitude of the cascode bias voltages, and the second set of programmable control bits is a set of current control bits used to control the stability of the cascode bias voltages.

8. The memory controller of claim 6, wherein each of the one or more cascode drivers includes a local bias generator coupled to the cascode transistors, wherein the bias voltage generator is configured to control the local bias generator to provide the cascode bias voltages to the cascode transistors based on a plurality of programmable control bits received by the bias voltage generator.

9. The memory controller of claim 6, wherein the bias voltage generator is configured to provide the cascode bias voltages to the cascode transistors of the one or more cascode drivers, and control the magnitude and stability of the cascode bias voltages based on a plurality of programmable control bits received by the bias voltage generator.

10. An apparatus comprising:
   one or more cascode drivers configured to drive one or more devices coupled to the apparatus, wherein each of the one or more cascode drivers includes a plurality of cascode transistors;
   a bias voltage generator coupled to the one or more cascode drivers, wherein the bias voltage generator includes a first control input terminal configured to receive a first set of programmable control bits and a second control input terminal configured to receive a second set of programmable control bits;
   wherein the bias voltage generator is configured to control cascode bias voltages provided to the cascode transistors of the one or more cascode drivers based on the first set and the second set of programmable control bits received by the bias voltage generator;
   wherein the second control input terminal is coupled to a third and a fourth programmable current source, wherein the third programmable current source is coupled to a third resistor and to a first terminal of a third amplifier, wherein the fourth programmable current source is coupled to an input transistor of a second current mirror, wherein an output transistor of the second current mirror is coupled to a fourth resistor and to a first terminal of a fourth amplifier; and
   wherein an output terminal of the fourth amplifier is coupled to the gate terminal of a first transistor and to the gate terminal of a second transistor, wherein the drain terminal of the first transistor is coupled to a second terminal of the first amplifier and to a fifth resistor, wherein the source terminal of the first transistor is coupled to a second terminal of the fourth amplifier and to the drain terminal of a third transistor, wherein an output terminal of the first amplifier is coupled to the gate terminal of the third transistor and to the gate terminal of a fourth transistor, wherein an output terminal of the second amplifier is coupled to the gate terminal of a fifth transistor and to the gate terminal of a sixth transistor, wherein the drain terminal of the fifth transistor is coupled to a second terminal of the third amplifier and to the source terminal of a seventh transistor, wherein an output terminal of the third amplifier is coupled to the gate terminal of the seventh transistor and to the gate terminal of an eighth transistor, wherein the drain terminal of the seventh transistor is coupled to a second terminal of the second amplifier and to a sixth resistor.

11. The apparatus of claim 10, wherein the first control input terminal is coupled to a first and a second programmable current source, wherein the first programmable current source is coupled to a first resistor and to a first terminal of a first amplifier, wherein the second programmable current source is coupled to an input transistor of a first current mirror, wherein an output transistor of the first current mirror is coupled to a second resistor and to a first terminal of a second amplifier.

12. The apparatus of claim 10, wherein the drain terminal of the second transistor is coupled to the gate terminal of the second transistor, wherein the source terminal of the second transistor is coupled to the gate terminal of a first cascode transistor and to the drain terminal of the fourth transistor, wherein the source terminal of the fourth transistor is coupled to the gate terminal of the fourth transistor, wherein the source terminal of the sixth transistor is coupled to the gate terminal of the sixth transistor, wherein the drain terminal of the sixth transistor is coupled to the gate terminal of a second cascode transistor and to the source terminal of the eighth transistor, wherein the drain terminal of the eighth transistor is coupled to the gate terminal of the eighth transistor.

13. The apparatus of claim 12, wherein a data input terminal is coupled to the gate terminal of a third cascode transistor and to the gate terminal of a fourth cascode transistor, wherein the drain terminal of the third cascode transistor is coupled to the source terminal of the first cascode transistor, wherein the drain terminal of the first cascode transistor is coupled to a driver output terminal and to the drain terminal of the second cascode transistor, wherein the source terminal of the second cascode transistor is coupled to the drain terminal of the fourth cascode transistor.

* * * * *